US010978606B2

(12) United States Patent
Stark

(10) Patent No.: US 10,978,606 B2
(45) Date of Patent: Apr. 13, 2021

(54) AVALANCHE DIODE AND METHOD OF MANUFACTURING AN AVALANCHE DIODE

(71) Applicant: STMicroelectronics (Research & Development) Limited, Marlow (GB)

(72) Inventor: Laurence Stark, Edinburgh (GB)

(73) Assignee: STMicroelectronics (Research & Development) Limited, Marlow (GB)

(*) Notice: Subject to any disclaimer, the term of this patent is extended or adjusted under 35 U.S.C. 154(b) by 7 days.

(21) Appl. No.: 16/157,876

(22) Filed: Oct. 11, 2018

(65) Prior Publication Data

US 2019/0131479 A1 May 2, 2019

(30) Foreign Application Priority Data

Oct. 26, 2017 (EP) ..................................... 17198619

(51) Int. Cl.
| | | |
|---|---|---|
| *H01L 31/107* | (2006.01) | |
| *H01L 31/113* | (2006.01) | |
| *H01L 31/18* | (2006.01) | |
| *H01L 31/101* | (2006.01) | |
| *H01L 31/0352* | (2006.01) | |
| *H01L 31/02* | (2006.01) | |
| *H01L 27/146* | (2006.01) | |
| *H01L 29/06* | (2006.01) | |

(52) U.S. Cl.
CPC ........ *H01L 31/107* (2013.01); *H01L 27/1461* (2013.01); *H01L 27/1464* (2013.01); *H01L 27/14649* (2013.01); *H01L 31/1136* (2013.01); *H01L 31/1804* (2013.01); *H01L 27/1463* (2013.01); *H01L 27/14689* (2013.01)

(58) Field of Classification Search
CPC ..................................................... H01L 31/107
See application file for complete search history.

(56) References Cited

U.S. PATENT DOCUMENTS

| | | | |
|---|---|---|---|
| 2002/0139970 A1* | 10/2002 | Iwanczyk | ......... H01L 27/14601 257/21 |
| 2003/0076484 A1 | 4/2003 | Bamji et al. | |
| 2006/0060932 A1* | 3/2006 | Rafferty | ............ H01L 27/14649 257/436 |
| 2007/0222012 A1 | 9/2007 | Aurola | |
| 2010/0271108 A1 | 10/2010 | Sanfilippo et al. | |
| 2016/0020273 A1* | 1/2016 | Woo | ..................... H01L 29/0634 257/329 |
| 2016/0163897 A1* | 6/2016 | Sakai | ................. H01L 31/03529 257/446 |
| 2017/0179279 A1* | 6/2017 | Lin | .................... H01L 29/66681 |
| 2018/0026147 A1* | 1/2018 | Zhang | ............. H01L 31/022416 257/292 |

FOREIGN PATENT DOCUMENTS

EP    2 787 531 A1    10/2014

OTHER PUBLICATIONS

Extended European Search Report, dated May 3, 2018, for European Application No. 17198619.3-1230, 11 pages.

* cited by examiner

*Primary Examiner* — Omar F Mojaddedi
(74) *Attorney, Agent, or Firm* — Seed IP Law Group LLP

(57) ABSTRACT

The present disclosure relates to an avalanche diode including at least one PN junction; at least one depletion structure located adjacent to the PN junction and configured to form a depletion region; and at least two electrodes to polarize the at least one PN junction.

18 Claims, 10 Drawing Sheets

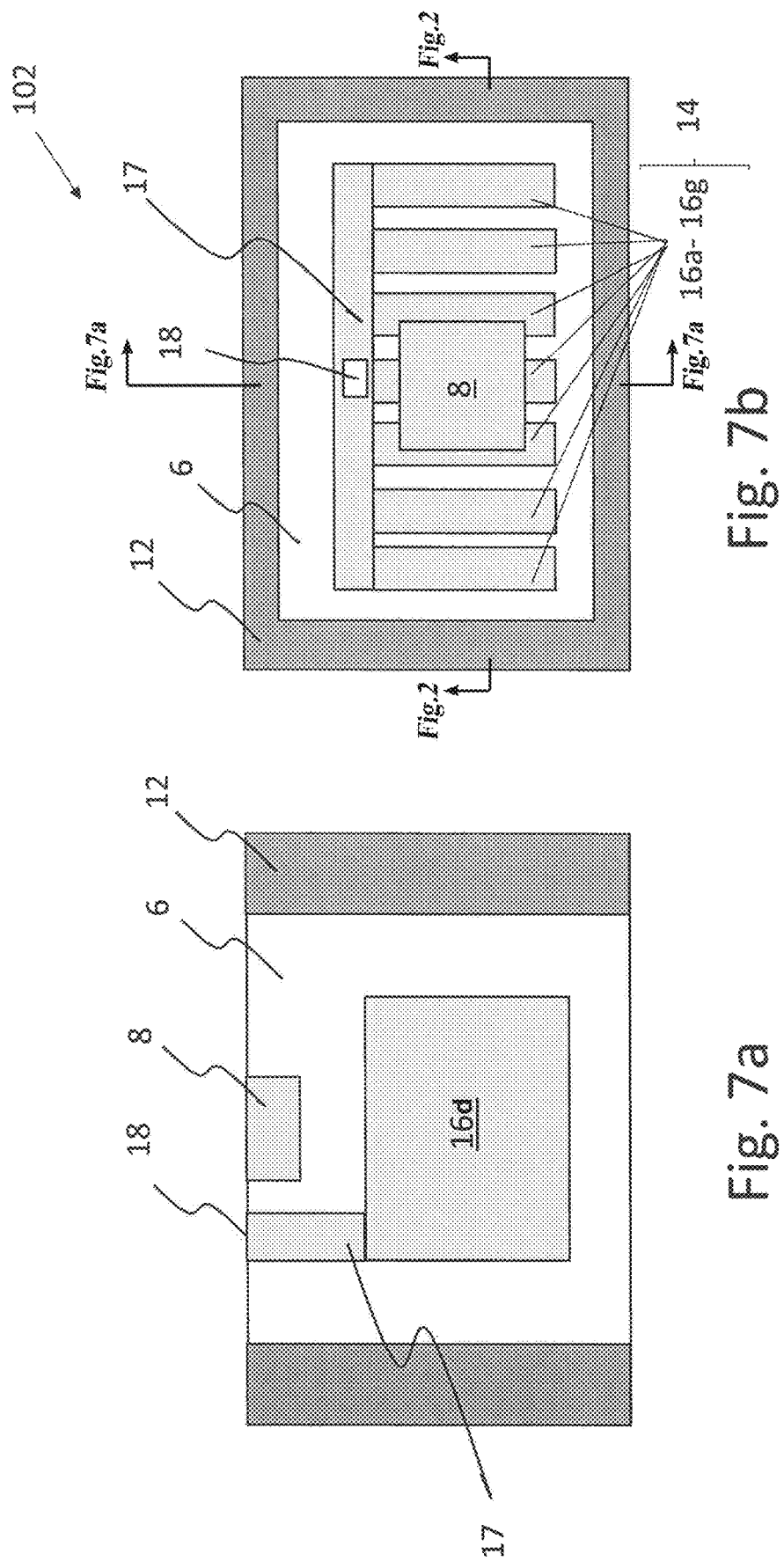

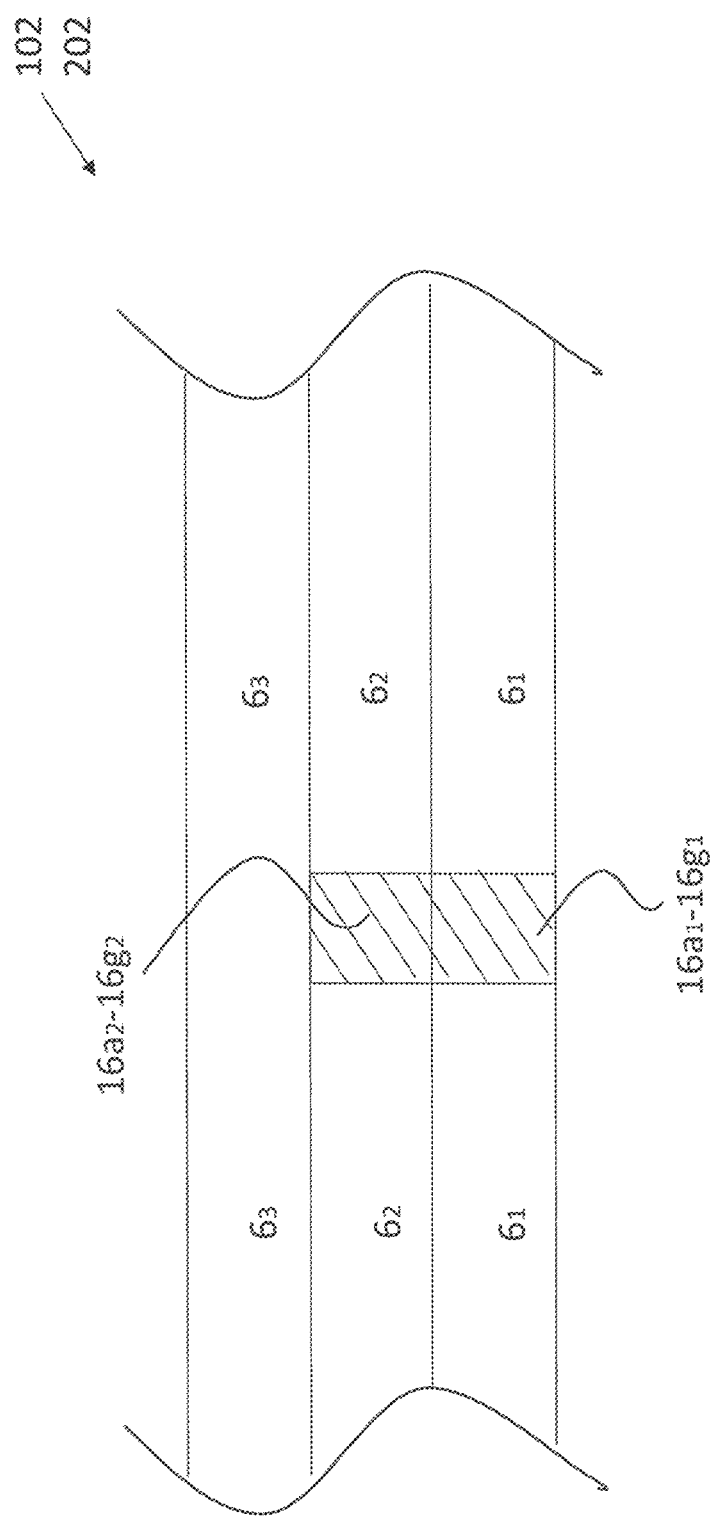

AVALANCHE DIODE AND METHOD OF MANUFACTURING AN AVALANCHE DIODE

BACKGROUND

Technical Field

The present disclosure relates to an avalanche diode (in particular an avalanche photodiode, for example a single photon avalanche diode) and a method of manufacturing an avalanche diode.

Description of the Related Art

Existing single photon avalanche diodes (SPADs) are based on a PN junction. The PN junction is reverse biased at a voltage exceeding a breakdown voltage. In this way, a carrier generated by a single photon can be injected into a depletion region and can cause a self-sustaining avalanche. The SPAD may be quenched allowing the PN junction to be reset to detect further photons.

BRIEF SUMMARY

According to one aspect, there is provided an avalanche diode, comprising: at least one PN junction; at least one depletion structure located adjacent to the PN junction and configured to form a depletion region; and at least two electrodes to polarize the at least one PN junction.

The at least one PN junction may include at least one first region of a first dopant type and at least one second region of a second dopant type.

The at least one depletion structure may include at least one component of the first dopant type arranged to fully deplete the at least one second region within the depletion region.

The at least one component may buried within the at least one second region.

The at least one component may have an elongated shape.

The at least one component may mainly extend along a longitudinal axis.

The at least one component may include a plurality of components.

The plurality of components may be aligned along a transversal axis.

The plurality of components may be equidistant.

The at least one first region may be aligned with a central longitudinal axis.

The at least one second region me formed by an epitaxial layer.

The epitaxial layer has a thickness equal to or greater than 5 µm.

The PN junction may be configured to be polarized with a reverse bias voltage equal to or smaller than 23V.

The first dopant type may be an N dopant type and the second dopant type may be a P dopant type or vice versa.

The at least one depletion structure may further include: at least one sinker of the first dopant type connected to the at least one depletion structure; and at least one electrode connected to the sinker.

The at least one depletion structure may further include: at least one gate; at least one drain; and at least two electrodes connected to the gate and to the drain.

According to a second aspect, there is provided a system comprising at least one avalanche diode comprising: at least one PN junction; at least one depletion structure located adjacent to the PN junction and configured to form a depletion region; and at least two electrodes to polarize the at least one PN junction.

The at least one PN junction may include at least one first region of a first dopant type and at least one second region of a second dopant type.

The at least one depletion structure may include at least one component of the first dopant type arranged to fully deplete the at least one second region within the depletion region.

The at least one component may buried within the at least one second region.

The at least one component may have an elongated shape.

The at least one component may mainly extend along a longitudinal axis.

The at least one component may include a plurality of components.

The plurality of components may be aligned along a transversal axis.

The plurality of components may be equidistant.

The at least one first region may be aligned with a central longitudinal axis.

The at least one second region me formed by an epitaxial layer.

The epitaxial layer may have a thickness equal to or greater than 5 µm.

The PN junction may be configured to be polarized with a reverse bias voltage equal to or smaller than 23V.

The first dopant type may be an N dopant type and the second dopant type may be a P dopant type or vice versa.

The at least one depletion structure may further include: at least one sinker of the first dopant type connected to the at least one depletion structure; and at least one electrode connected to the sinker.

The at least one depletion structure may further include: at least one gate; at least one drain; and at least two electrodes connected to the gate and to the drain.

The system may be an imaging sensor.

According to a third aspect, there is provided a method of manufacturing an avalanche diode, comprising: forming at least one depletion structure configured to form a depletion region adjacent to at least one PN junction; forming the at least one PN junction; and forming at least two electrodes to polarize the at least one PN junction.

Forming the at least one PN junction may include forming includes forming at least one first region of a first dopant type and forming at least one second region of a second dopant type.

Forming the at least one depletion structure may include forming at least one component of the first dopant type arranged to fully deplete the at least one second region within the depletion region.

The method may further comprise: forming a first portion of the at least one second region; implanting a first portion of the least one component within the first portion of the at least one second region; forming a second portion of the at least one second region; and implanting a second portion of the least one component within the second portion of the at least one second region. The at least one component may buried within the at least one second region.

The at least one component may have an elongated shape.

The at least one component may mainly extend along a longitudinal axis.

The at least one component may include a plurality of components.

The plurality of components may be aligned along a transversal axis. The plurality of components may be equidistant.

The at least one first region may be aligned with a central longitudinal axis.

The at least one second region me formed by an epitaxial layer.

The epitaxial layer has a thickness equal to or greater than 5 μm. The PN junction may be configured to be polarized with a reverse bias voltage equal to or smaller than 23V.

The first dopant type may be a N dopant type and the second dopant type may be a P dopant type or vice versa.

The at least one depletion structure may further include: at least one sinker of the first dopant type connected to the at least one depletion structure; and at least one electrode connected to the sinker.

The at least one depletion structure may further include: at least one gate; at least one drain; and at least two electrodes connected to the gate and to the drain.

BRIEF DESCRIPTION OF THE DRAWINGS

Reference will now be made, by way of example, to the accompanying drawings in which:

FIG. 7a is a cross-sectional view of an avalanche diode according to the first embodiment along the axis shown in FIG. 7b.

FIG. 7b is a plan view of an avalanche diode according to the first embodiment.

FIG. 10 is a partial view of a longitudinal cross-section of an avalanche diode according to the first and/or second embodiments.

DETAILED DESCRIPTION

Figure 1:
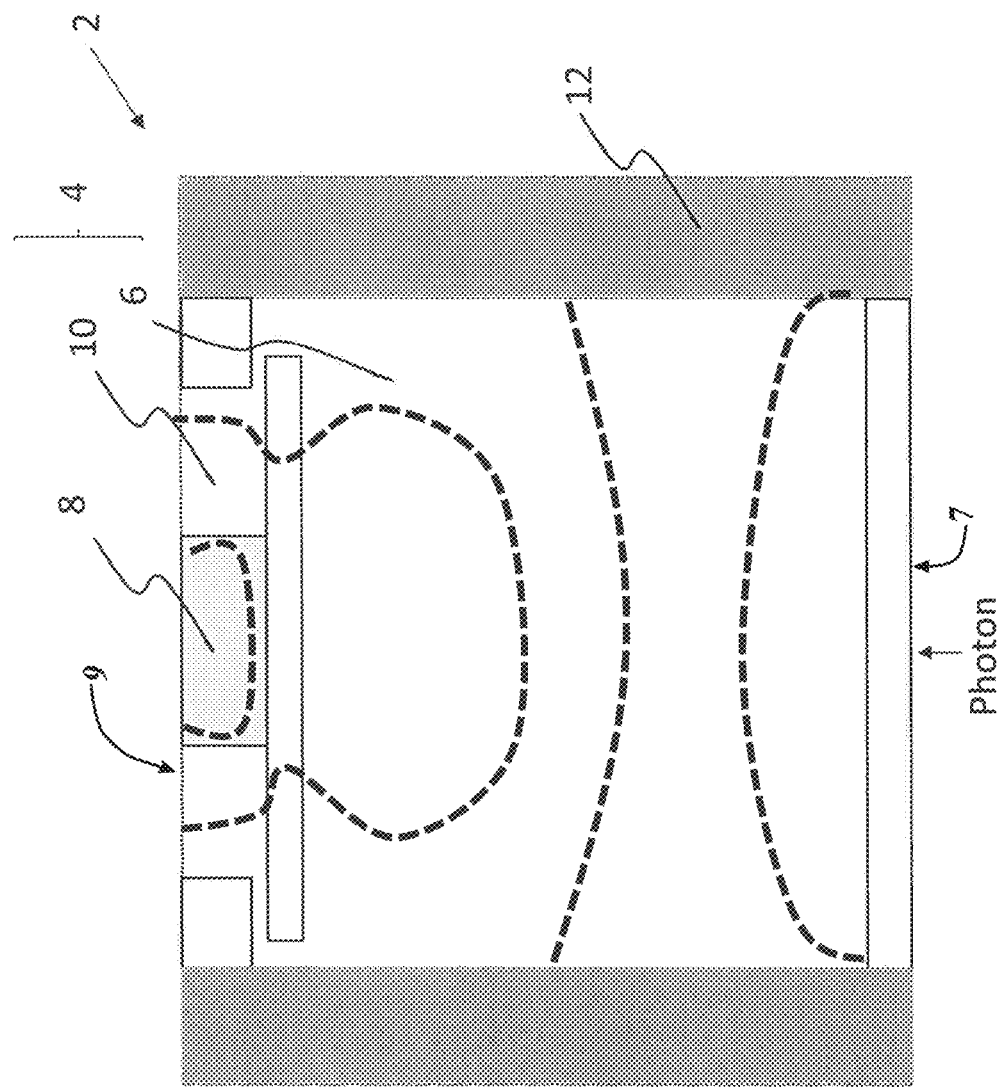
FIG. 1 is a longitudinal cross-section of an avalanche diode.

A diode is an electrical device allowing current to move through it in one direction with far greater ease than in the other. The most common kind of diode in modern circuit design is the semiconductor diode and is based on a PN junction.

A PN junction includes a P region (i.e., region doped with a P dopant) and an N region (i.e., region doped with an N dopant type). The N region contains electrons in excess while the P region contains holes in excess. When the PN junction is formed holes are naturally diffused from the P region to the N region and recombined with electrons. Likewise, electrons are naturally diffused from the N region to the P region and are recombined with holes. In this way, a depletion region with pairs of recombined holes and electrons is formed at the interface (i.e., the junction) of the P region and the N region. Stated differently, the depletion region is formed where the P region and the N region meet each other.

The diffusion of holes from the P region leaves negative acceptor ions in the P region. While the diffusion of electrons from the N region leaves positive donor ions in the N region. This creates a depletion region electric field that provides a force opposing the continued diffusion of holes and electrons. When the depletion region electric field is sufficiently high the diffusion of holes and electrons is interrupted and the depletion region reaches equilibrium.

The width or size of the depletion region depends on the concentration of holes in the P region, the concentration of electrons in the N region, and a voltage supply applied to the PN junction.

When the voltage supply is a forward bias voltage supply, the P region is connected to a positive terminal of the voltage supply and the N region is connected to a negative terminal of the voltage supply. In this way, the holes in the P region and the electrons in the N region are pushed toward the interface of the P region and the N region. As a result, the width or size of the depletion region decreases.

When the voltage supply is a reverse bias voltage supply, the P region is connected to a negative terminal of the voltage supply and the N region is connected to a positive terminal of the voltage supply. In this way, the holes in the P region and the electrons in the N region are pushed away from the interface of the P region and the N region. As a result, the width or size of the depletion region increases.

The width or size of the depletion region increases with the increase in the reverse bias voltage supply up to a certain voltage. If the reverse bias voltage supply is increased beyond that voltage, the junction breaks down and allows a reverse current. At this point, a small increase in the voltage will rapidly increase the reverse current. The voltage at which the PN junction breaks down occurs is known as the "breakdown voltage".

The depletion region breakdown may be caused by two mechanisms: Zener breakdown and avalanche breakdown.

In avalanche breakdown, when the reverse voltage supply exceeds the breakdown voltage, electrons diffused in the depletion region are accelerated. The electrons collide with atoms and free bound electrons. Some of these electrons recombine with holes. Others are accelerated in the depletion region, collide with atoms and free further bound electrons, and so on. Likewise, holes diffused in the depletion region area are accelerated in the opposite direction and initiate a similar process. In this way, a self-sustaining avalanche is created and the reverse current increases.

An avalanche diode, such as a single photon avalanche detector (SPAD), follows the above principle. The PN junction is reverse biased at a voltage exceeding the breakdown voltage. When a photon with sufficient energy is absorbed, a bound electron is freed in the depletion region. The electron is accelerated, collides with atoms and frees further bound electrons. Some of these electrons recombine with holes. Others are accelerated, collide with atoms and free further bound electron, and so on.

FIG. 1 represents an avalanche diode 2, for example, a single photon avalanche diode (SPAD). As will be discussed in further detail below, the avalanche diode 2 may be implemented as part of a back side illuminated light detector. The avalanche diode 2 may typically be integrated in a system, such as an imaging sensor.

The avalanche diode 2 comprises a PN junction 4 including a P region 6 (i.e., a region or layer doped with a P dopant to have a P-type conductivity) and an N region 8 (i.e., a region or layer doped with an N dopant to have an N-type conductivity). In one embodiment, the P region 6 is an epitaxial layer of P dopant type grown on a Silicon substrate (not shown in FIG. 1), and the N region 8 is a well of N dopant type formed within the epitaxial layer. In one embodiment, as shown in FIG. 1, the N region 8 is centered (i.e., aligned with a central longitudinal (vertical) axis of the avalanche diode 2). The PN junction 4 also comprises a depletion region 10 (also known as depletion layer or depletion zone) that is naturally formed at the interface (i.e., junction) of the P region 6 and the N region 8 as described above. For example, as shown in FIG. 1, the depletion region 10 is formed between the P region 6 and the N region 8 such that the P region 6 and the N region 8 are spaced from each other by the depletion region 10.

The avalanche diode 2 comprises an anode (not shown in FIG. 1) connecting the P region 6 to a negative terminal of a voltage supply and a cathode (not shown in FIG. 1) connecting the N region 8 to a positive terminal of the voltage supply (not shown in FIG. 1). In this way, the PN junction 4 can be polarized with a reverse biased voltage exceeding a breakdown voltage.

The avalanche diode 2 advantageously comprises a trench isolation region 12 surrounding the PN junction 4 to prevent current leakage from/toward adjacent semiconductor device components. The trench isolation region 12 is, for example, made of Silicon Dioxide ($SiO_2$).

In one embodiment, the avalanche diode 2 shown in FIG. 1 is a back side illuminated avalanche diode. That is, the avalanche diode 2 may be part of an illuminated light detector that is positioned in front of various metal layers and/or electrical components (e.g., resistors, capacitors, processors, etc.) that may be coupled to the illuminated light detector. By positioning the illuminated light detector in front, the various metal layers and/or electrical components will not block any received light from reaching the illuminated light detector. As a result, the amount of light captured can be increased and low-light performance can be improved. As discussed above, when a photon with sufficient energy is absorbed via the back side (i.e., a side 7 of the avalanche diode 2), a bound electron is freed in the depletion region 10, accelerated, collides with atoms, and frees further bound electrons. Some of these electrons recombine with holes. Others are accelerated in, collide with atoms and free further bound electrons, and so on.

A challenge with avalanche diodes, such as avalanche diode 2, is to provide enhanced near infrared (NIR) photon detection probability (PDP). Indeed, as an infrared photon has low energy, it is less likely to free a bound electron in the depletion region to trigger an avalanche, especially when the depletion region is far from the back side.

Silicon is not very sensitive in the NIR/IR region of the spectrum (in comparison to the visible region) so a much thicker piece of silicon should be used to allow photons to be absorbed. For example, an image sensor with an approximately 3 µm thick epitaxial layer can achieve more than 70% quantum efficiency (QE) at 550 nm (green), but less than 10% at 940 nm (NIR/IR).

Another challenge with avalanche diodes is to minimize the transit time. Stated differently, a challenge with avalanche diodes is to decrease the travel time of, for example, carriers to move across the depletion region 10. Indeed, if the transit time is too large then the ability to accurately correlate the signal generated by the avalanche diode with time may be altered and the ranging performance may be worsened.

A possible solution to improve avalanche diodes, such as the avalanche diode 2, is to expand the depletion region 10 toward the back side by increasing the reverse bias voltage. In this way, an infrared photon is more likely to free a bound electron in the depletion region to trigger an avalanche. However, this solution is not always adopted because, when the epitaxial layer and therefore the P region 6 is thick, an excessive reverse bias voltage should be used to expand the depletion region 10 sufficiently toward the back side to detect an infrared photon.

For example, the inventors have observed that a reverse bias voltage of 23V (18V on the cathode and −5V on the anode) does not expand the depletion region 10 sufficiently toward the back side to detect an infrared photon when the P region 6 is 7 µm thick or thicker.

Also, this solution provides a poor lateral extension and as a result impacts the photon detection probability (PDP) and the transit time of the avalanche diode 2. Indeed, there are large areas of the substrate outside of the depletion region 10. Areas outside of depletion region 10 lead to a minimal electric field, slow collection and a long transit time for generated carriers.

Scientific image sensors conventionally address the above challenges by creating a thick substrate (e.g., a thickness greater than 30 µm) and applying a backside bias voltage. Typically this backside bias is very large (e.g., approximately −100V) and therefore troublesome to generate for most applications. Alternatively, a negative voltage may be applied to the backside of the P region, whereas the front side (i.e., a side 9 of the avalanche diode 2) of the P region is held at 0V. This creates a drift field, but the simulation results show that the arrangement of holding the front side of the P region at 0 v is not particularly effective for a given voltage budget.

Figure 2:
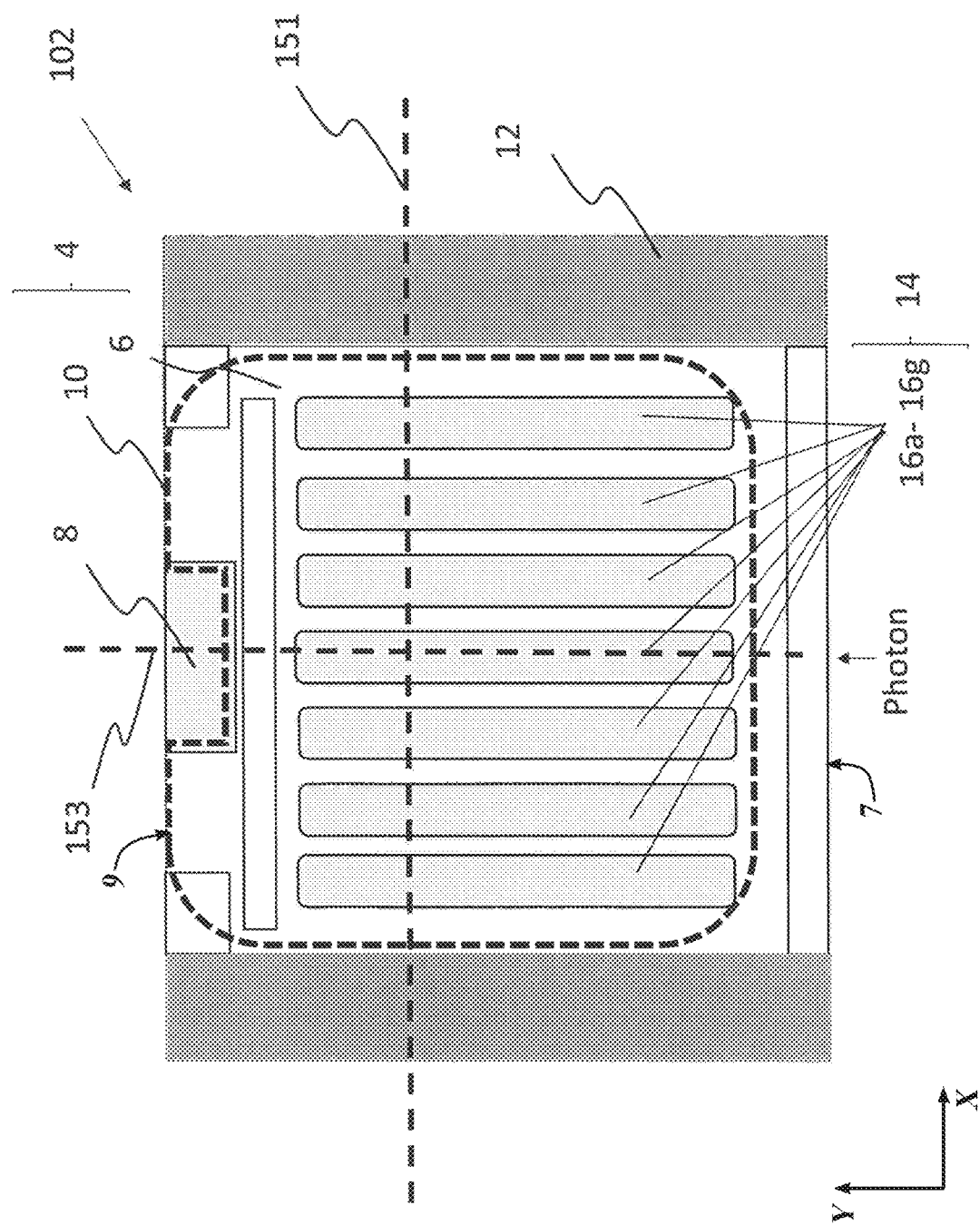
FIG. 2 is a longitudinal cross-section of an avalanche diode according to a first embodiment.

The following embodiments enhance near infrared (NIR) photon detection probability (PDP) without increasing the reverse bias voltage (or with a minimal increase of the reverse bias voltage) and with a minimal transit time. FIG. 2 represents a longitudinal cross-section of an avalanche diode 102 according to a first embodiment. In contrast to the avalanche diode 2 shown in FIG. 1, the avalanche diode 102 comprises an N structure 14 (i.e., a structure of a N dopant type) buried within the P region 6. The N structure 14 is designed to expand the depletion region 10 without increasing the reverse bias voltage (or with a minimal increase of the reverse bias voltage).

The N structure 14 includes a plurality of N components 16a to 16g (i.e., components of an N dopant type) buried within the P region 6. As will be discussed in further detail below, in one embodiment, the plurality of N components 16a to 16g is spaced from an exposed or upper surface of the P region 6. In one embodiment, the plurality of N components 16a to 16g is doped regions within the P region 6. Here, seven N components 16a to 16g are represented but one skilled in the art will understand that any number of N components 16a to 16g can be used. In one embodiment, as shown in FIG. 2, each of the N components 16a to 16g has an elongated shape with a major axis which extends along longitudinal axis (i.e., the N components 16a to 16g extend in a vertical (Y) direction in FIG. 2). In one embodiment, each of the N components 16a to 16g are spaced from each other by portions of the P region 6.

In one embodiment, the N components 16a to 16g are aligned along a transversal axis (i.e., the N components 16a to 16g extend into and out of the cross section shown in FIG. 2 and are positioned along a horizontal (X) direction in FIG. 2). In one embodiment, the N components 16a to 16g are advantageously located equidistant from neighboring N components 16a to 16g. Stated differently, in one embodiment, the N components 16a to 16g are equally spaced from each other. In one embodiment, the N components 16a to 16g are arranged (i.e., located, doped and/or dimensioned) to at least partially deplete the P region 6 surrounding each of the N components 16a to 16g. In one embodiment, the N components 16a to 16g are arranged to fully or substantially deplete the area 6 within the depletion region 10. The N components 16a to 16g therefore can be considered to form "plate" like structures within the detector which are stacked on edged between the optical window of the detector and the active PN junction region. Although the N components 16a to 16g in FIG. 2 show "plate" like structures it will be understood that other suitable component shapes and distributions may be implemented in other embodiments.

As explained above, thanks to the N structure 14 the P region 6 is further depleted and the depletion region 10 of the avalanche diode 102 can be expanded toward the back side (in comparison to the depletion region 10 of the avalanche diode 2 shown in FIG. 1). The depletion region 10 is no longer limited to the interface between the P region 6 and the N region 8 as shown, for example, in FIG. 1. The depletion region 10 now extends between a shallow band of non-depleted P region 6 on a front side of the avalanche diode 102 and a shallow band of non-depleted P region 6 on a back side 7 of the avalanche diode 102. Stated differently, the depletion region 10 is enlarged such that the N structure 14, including the N components 16a to 16g, is within the depletion region 10. The depletion region 10 behaves as a plate capacitor dielectric.

Figure 3:
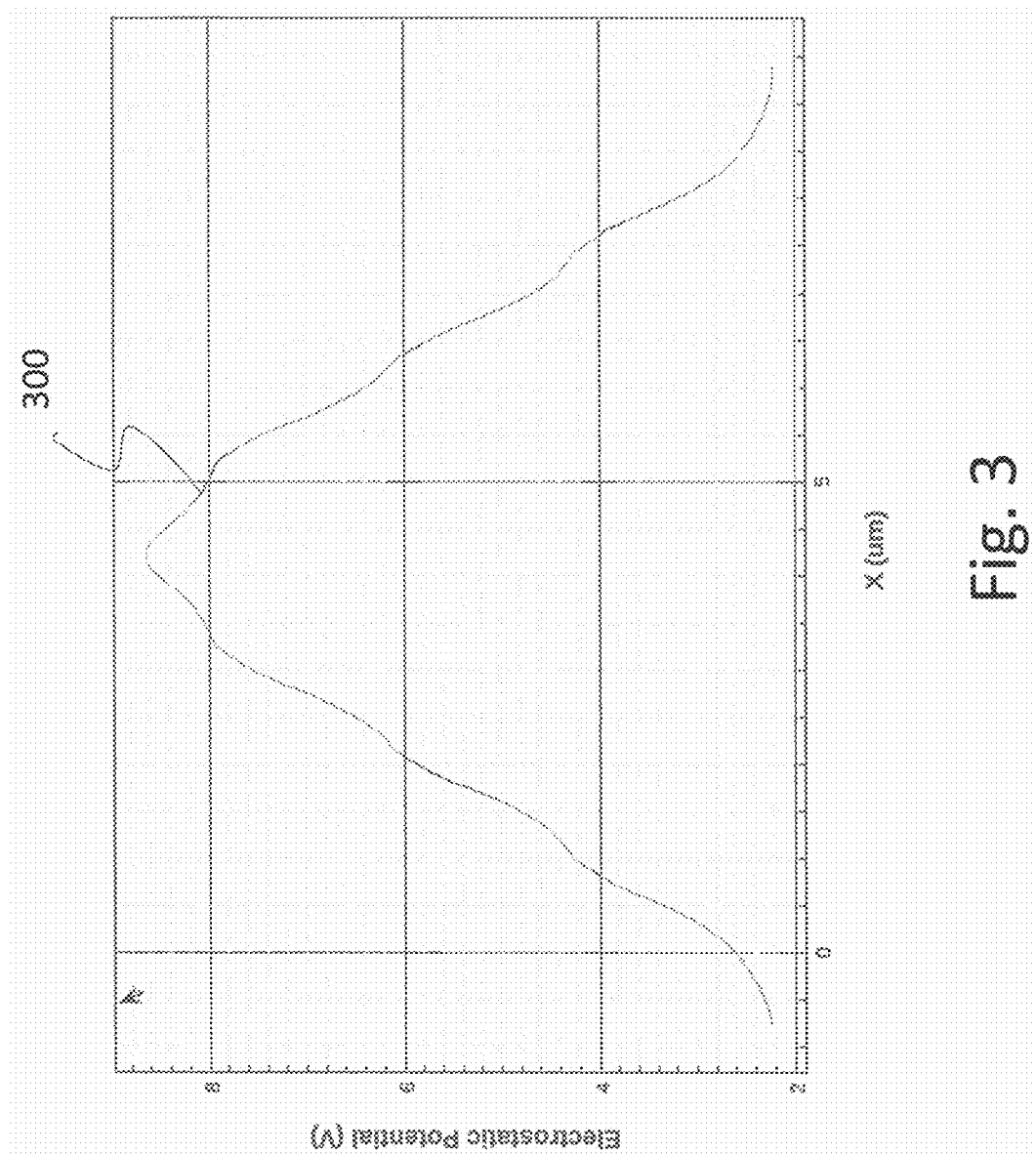
FIG. 3 is a graph showing a transversal electrostatic potential profile of the avalanche diode according to the first embodiment.

FIG. 3 is a graph showing a transversal electrostatic potential profile 300 along the dashed axis 151 of the avalanche diode 102 shown in FIG. 2. As can be seen the electrostatic potential is substantially symmetrical with regard to a central longitudinal axis 153 shown in FIG. 2. As shown in FIG. 3, from left to right the electrostatic potential monotonically increases, peaks at the central longitudinal axis 153, and monotonically decreases.

Figure 4:
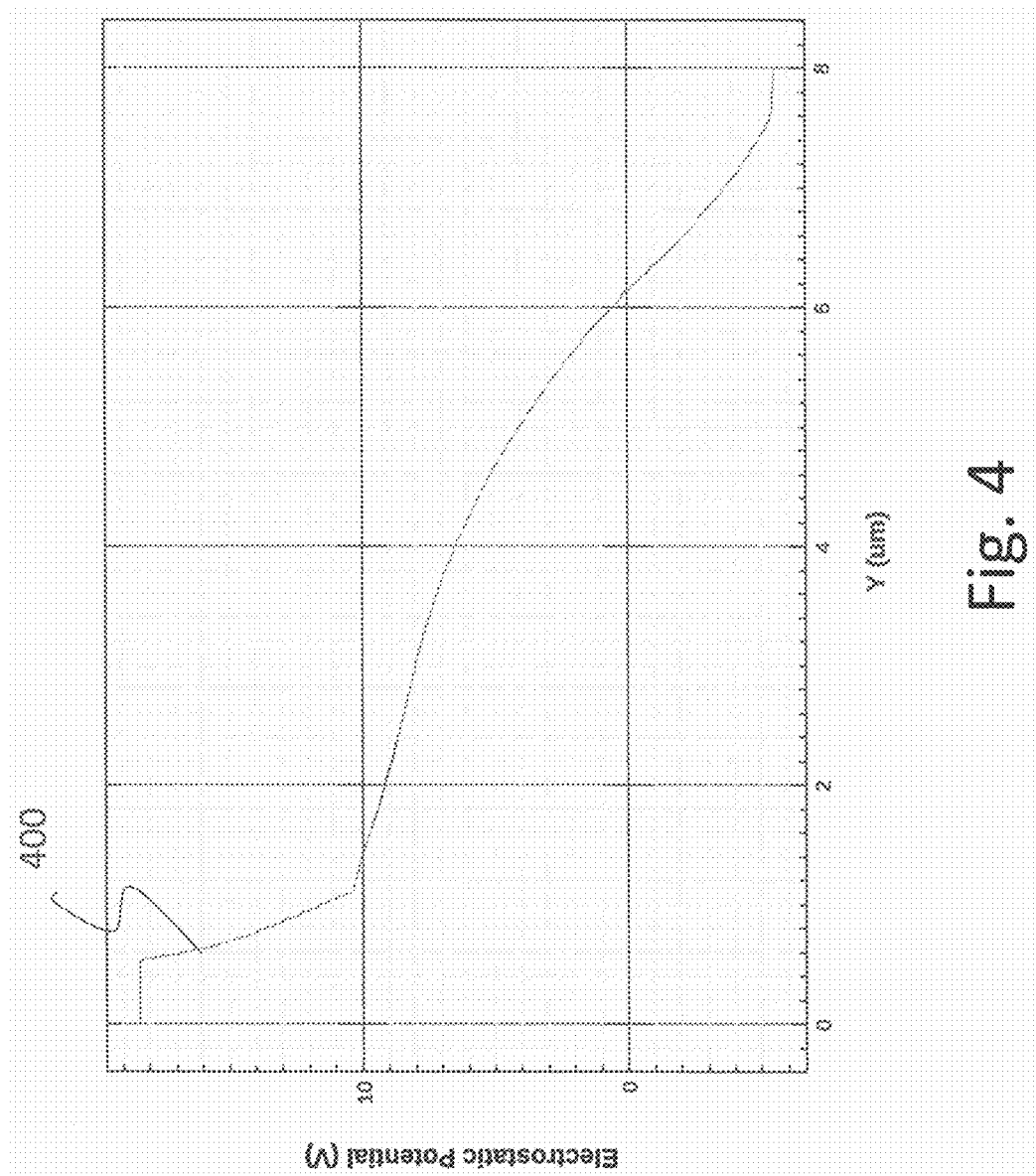
FIG. 4 is a graph showing a longitudinal electrostatic potential profile of the avalanche diode according to the first embodiment.

FIG. 4 is a graph showing a longitudinal electrostatic potential profile 400 along the dashed axis 153 (i.e., the central longitudinal axis 153) of the avalanche diode 102 shown in FIG. 2. As shown in FIG. 4, the electrostatic potential monotonically increases from the substrate adjacent to the optical window to the N region 8 (i.e., avalanche region).

Figure 5:
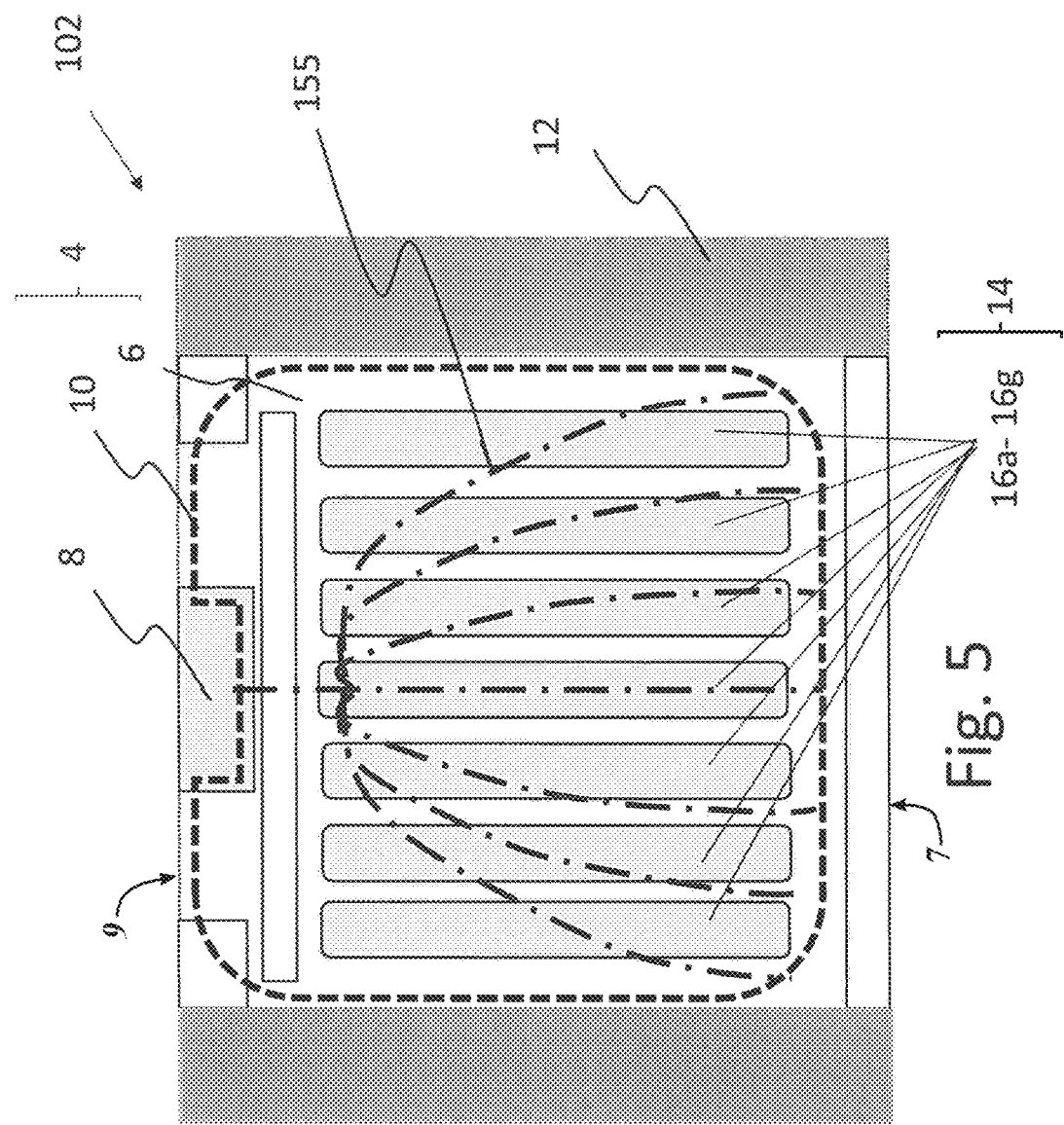
FIG. 5 is a longitudinal cross-section of an avalanche diode according to a first embodiment with likely carrier paths.

FIG. 5 represents a longitudinal cross-section view of the avalanche diode 102 shown in FIG. 2 with likely carrier paths 155. The carrier paths 155 are shown in FIG. 5 converging toward the N region 8 (i.e., avalanche region) in such a manner that the carriers are funneled thereto. Stated differently, the carrier paths 155 are spaced from each other near the side 7 of the avalanche diode 102, travel across the N structure 14, and intersect each other near the N region 8.

Figure 6:
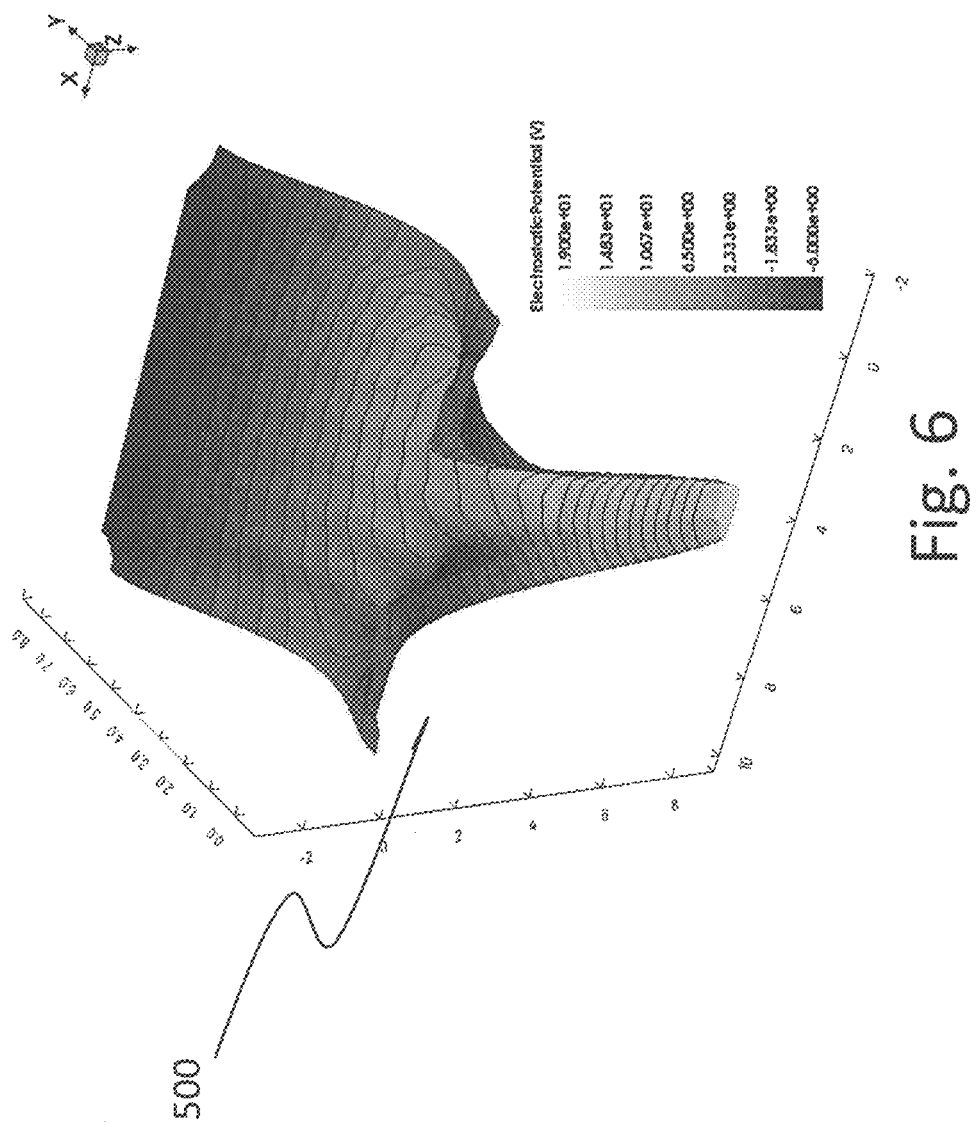
FIG. 6 is a graph showing an electrostatic potential profile for the avalanche diode according to the first embodiment.

FIG. 6 represents a three dimensional electrostatic potential profile 500 for the avalanche diode 102. The electrostatic potential profile has a bowl or a bottleneck shape and expands in three dimensions throughout the P region 6. In this way, the structure 14 ensures that no dead spots are left in the P region 6. As such, any carriers generated within the diode 102 are accelerated toward the N region 8 and the average transition time for the carriers is reduced.

The avalanche diode 102 shown in FIG. 2 presents various advantages over the avalanche diode 2 shown in FIG. 1. Firstly, the avalanche diode 102 implemented in the embodiments described herein allows enhanced near infrared (NIR) photon detection probability (PDP) without having to use an increased reverse bias voltage (or with, at most, a minimal increase of the reverse bias voltage). Indeed, thanks to the N structure 14, an excessive reverse bias voltage may not be needed to expand the depletion region 10 toward the back side. In this way, the thickness of the epitaxial layer and thus the P region 6 can be increased and/or the reverse bias voltage can be decreased.

In the example discussed above with reference to the avalanche diode 2 shown in FIG. 1, a reverse bias voltage of 23V (e.g., 18V on the cathode and −5V on the anode) did not expand the depletion region 10 sufficiently toward the back side to detect an infrared photon when the P region 6 was 7 μm thick or thicker. Now, with the avalanche diode 102 according to the embodiments described herein a reverse bias voltage equal to or lower than 23V may expand the depletion region 10 sufficiently toward the back side to detect an infrared photon when the P region 6 is 7 μm thick or thicker.

In addition, because carriers are funneled toward the N region 8 (i.e., avalanche region), the avalanche region can be reduced and as a result dark current and power consumption can be lower and the maximum count rate can be higher.

In general, the dark current is proportional to the size of the avalanche region. The smaller the avalanche region, the lower the dark current. Similarly, the power consumption is dependent on the capacitance, which is also proportional to the size of the avalanche region. The smaller the avalanche region, the smaller the capacitance and the lower the power consumption. The smaller the capacitance, the quicker (theoretically) the recharge of the SPAD and the greater the maximum count rate.

FIGS. 7a and 7b show a cross-sectional and a plan view, respectively, of the avalanche diode 102 shown in FIG. 2. It is noted that upper portions of the P region 6 are removed in FIG. 7b in order to show upper surfaces of the N components 16a to 16g. The avalanche 102 comprises an N region or sinker 17 (i.e., sinker doped with an N dopant) connected to the N structure 14. For example, as shown in FIG. 7a, the N sinker 17 is a region which extends from one surface of the avalanche diode 102 to an upper surface of the N components 16a-16g. The N sinker 17 therefore may electrically connect the N components 16a-16g altogether. The avalanche diode 102 also comprises an electrode 18 (N well contact) electrically connecting the N sinker 17 to a supply voltage (not shown in FIGS. 7a and 7b). The N structure 14 can be polarized so that a reverse bias voltage is applied between the P region 6 and the N structure 14. In this way, the P region 6 can be further depleted and the depletion region 10 can be further expanded toward the back side (i.e., optical window) of the avalanche diode 102. As best shown in FIG. 7a, in one embodiment, each of the N components 16a-16g have a rectangular shape. Further, in one embodiment, the plurality of N components 16a to 16g is spaced from an exposed or upper surface of the P region 6. In addition, in one embodiment, the N region 8 directly overlies at least one of the plurality of N components 16a to 16g. As best shown in FIG. 7b, the trench isolation region 12 encircles the N structure 14.

Figure 8B:
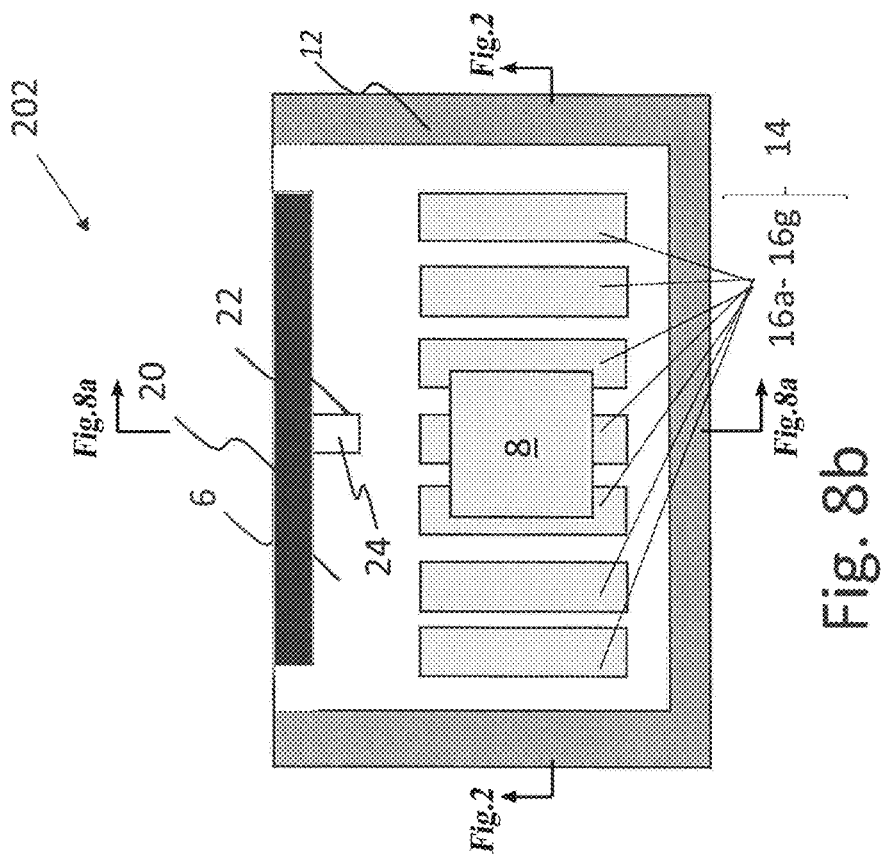
FIG. 8b a plan view of an avalanche diode according to the second embodiment.
Figure 8A:
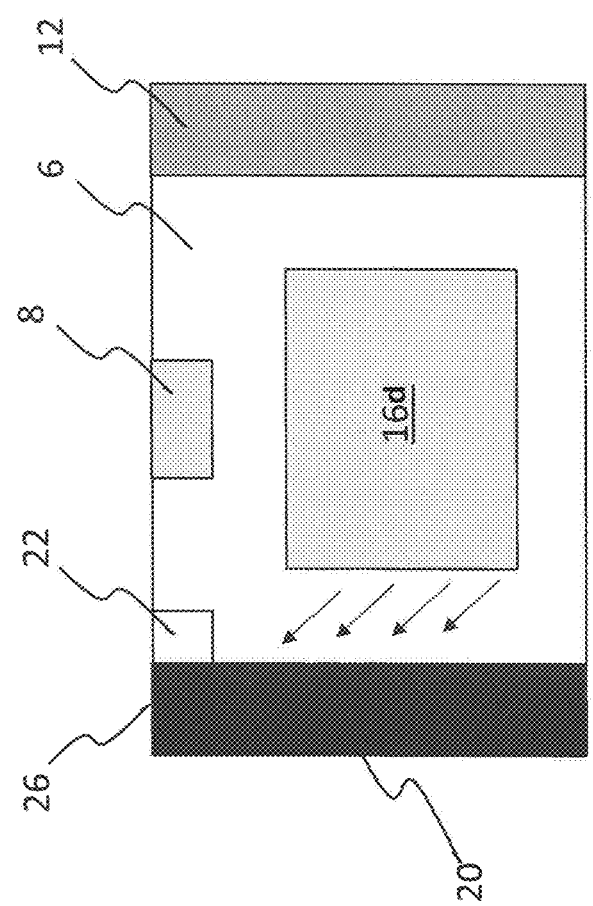
FIG. 8a is a cross-sectional view of an avalanche diode according to a second embodiment along the axis shown in FIG. 8b.

FIGS. 8a and 8b show a cross-sectional view and a plan view, respectively, of an avalanche diode 202 according to a second embodiment. It is noted that upper portions of the P region 6 are removed in FIG. 8b in order to show upper surfaces of the N components 16a to 16g. In contrast to the avalanche diode 102 shown in FIGS. 2, 7A, and 7b, the avalanche diode 202 does not include the N region or sinker 17 (i.e., sinker doped with a N dopant) that is connected to the N structure 14. Instead, the avalanche diode 202 comprises a trench gate 20 and a trench drain 22. In one embodiment, the trench gate 20 includes a thin oxide liner (e.g., 20 nm thick) and a polysilicon trench fill. In one embodiment, the trench drain 22 is a shallow N-type region. For example, the trench drain 22 may be similar in dimensions and composition to the drain/source terminals of a MOSFET. As best shown in FIG. 8b, the trench isolation region 12 is on three sides of the N structure 14, and the trench gate 20 is on a fourth side of the N structure 14.

The avalanche diode 202 further comprises an electrode 24 connecting the trench drain 22 to a supply voltage (not shown in FIGS. 8a and 8b) and an electrode 26 connecting the trench drain to a supply voltage (not shown in FIGS. 8a and 8b). In this way, as shown in FIG. 8a, the trench gate 20 and the trench drain 22 can be polarized so that a longitudinal channel is created between the trench drain 22 and the N structure 14, and along the trench gate 20. In other words, the P region 6, the N structure 14, the trench gate 20, and the trench drain 20 operate like a field effect transistor (FET) transistor. In this way, the area 6 can be further depleted and the depletion region 10 can be further expanded toward the back side.

Figure 9:
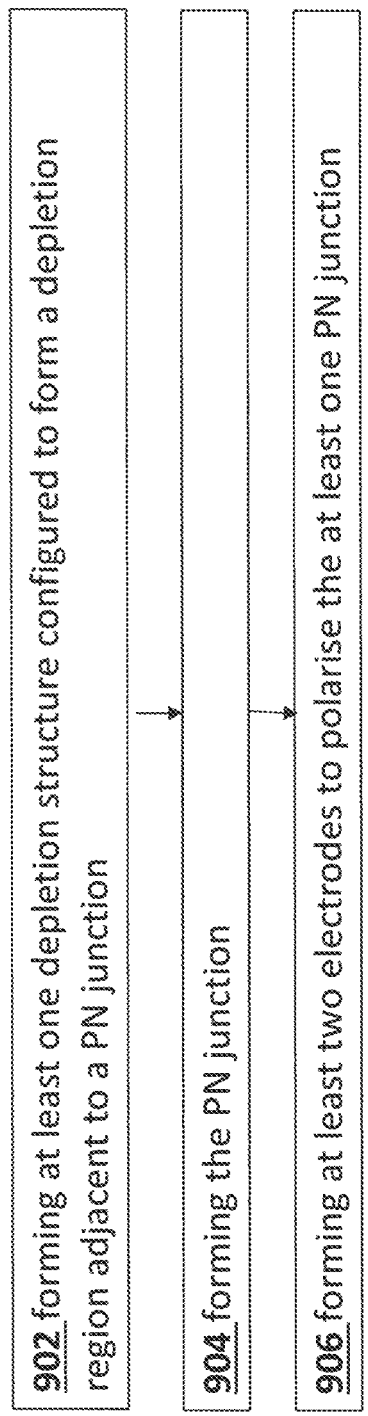
FIG. 9 is a simplified diagram of a method of manufacturing the avalanche diode according to the first and/or second embodiments.

FIG. 9 represents a simplified diagram of a method of manufacturing the avalanche diodes 102 and 202. The method includes the steps of forming the structure 14 in the step 902, forming the PN junction 4 in step 904, and forming the at least two electrodes to polarize the PN junction in step 906. For example, in step 902, the P region 6 may be formed using a growth or deposition process, and then implanted with an N dopant type to form the N structure 14. Then, in step 904, the PN junction 4 may be formed by implanting the P region 6 with an N dopant type to form the N region 8. In step 906, electrodes, such as electrodes 18, 24, and 26, may be formed using a growth or deposition process. It should be understood that the steps of FIG. 9 are not necessarily performed separately in a sequential order but can be combined as it is the case on FIG. 10 with steps 902 and 904. FIG. 10 is a partial view of a longitudinal cross-section of the avalanche diodes 102 and 202.

First, a portion or sub-layer $6_1$ of the P region 6 is formed using, for example, a growth or deposition process. Then, portions $16a_1$-$16g_1$ of the N components 16a-16g are implanted within the portion $6_1$. Second, another portion or sub-layer $6_2$ of the P region 6 is formed on top of and in alignment of the portion $6_1$ and the portions $16a_1$-$16g_1$ using, for example, a growth or deposition process. Then, portions $16a_2$-$16g_2$ of the N components 16 are implanted within the portion $6_2$ on top of the portions $16a_1$-$16g_1$. Finally, a portion $6_3$ of the P region 6 is formed on top of the portion $6_2$ and the portions $16a_2$-$16g_2$ using, for example, a growth or deposition process.

One skilled in the art will understand that the number of portions of the P region 6 is not limited to three and the number of portions of the N components 16a-16g is not limited to two. These numbers can be adjusted based on the thickness of the P region 6 and N components 16a-16g.

Various embodiments with different variations have been described here above. It should be noted that those skilled in the art may combine various elements of these various embodiments and variations. For example, areas of the N dopant type could be swapped for areas of the P dopant type and vice versa. As an example, the P region 6 may be changed to have N type conductivity, and the N structure 14 may be changed to have P type conductivity.

Such alterations, modifications, and improvements are intended to be part of this disclosure, and are intended to be within the scope of the claims. Accordingly, the foregoing description is by way of example and is not intended to be limiting.

In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An avalanche diode, comprising:
   a layer having a first conductivity type;
   a first region in the layer, the first region having a second conductivity type, the layer and the first region forming a PN junction;
   a depletion structure in the layer and adjacent to the PN junction, the depletion structure configured to form a depletion region in the layer, the depletion structure including a plurality of second regions in the layer, the plurality of second regions having the second conductivity type, each of the plurality of second regions having a rectangular shape, lengths of the plurality of second regions extending in a first direction, widths of the plurality of second regions extending in a second direction transverse to the first direction, the plurality of second regions being arranged along the second direction, the first region directly overlying at least one of the plurality of second regions in a third direction transverse to the first and second directions, the first region being separated from the plurality of second regions by the layer; and
   electrodes configured to polarize the PN junction.

2. The avalanche diode of claim 1 wherein the plurality of second regions are arranged to deplete portions of the layer that are within the depletion region.

3. The avalanche diode of claim 1 wherein the plurality of second regions are buried within the layer.

4. The avalanche diode of claim 1 wherein the plurality of second regions are positioned substantially equidistant from each other.

5. The avalanche diode of claim 1 wherein the first region is aligned with a central axis of the avalanche diode.

6. The avalanche diode of claim 1 wherein the depletion structure further includes:
   a third region in the layer, the third region having the second conductivity type, the third region electrically coupling the plurality of second regions together.

7. The avalanche diode of claim 1, wherein the depletion structure further includes:
   a gate; and
   a drain.

8. A method of making an avalanche diode, comprising:
   forming a layer having a first conductivity type;
   forming a first region in the layer, the first region having a second conductivity type, the layer and the first region forming a PN junction;
   forming a depletion structure in the layer and adjacent to the PN junction, the depletion structure configured to form a depletion region in the layer, the depletion structure including a plurality of second regions in the layer, the plurality of second regions having the second conductivity type, each of the plurality of second regions having a rectangular shape, lengths of the plurality of second regions extending in a first direction, widths of the plurality of second regions extending in a second direction transverse to the first direction, the plurality of second regions being arranged along the second direction, the first region directly overlying at least one of the plurality of second regions in a third direction transverse to the first and second directions, the first region being separated from the plurality of second regions by the layer; and forming electrodes configured to polarize the PN junction.

9. The method of claim 8 wherein forming the plurality of second regions are arranged to deplete portions of the layer that are within the depletion region.

10. The method of claim 8 wherein forming the layer and the depletion structure includes:
   forming a first sub-layer of the layer;
   implanting a first portion of the first sub-layer with a dopant having the second conductivity type;
   forming a second sub-layer of the layer; and
   implanting a second portion of the second sub-layer with a dopant having the second conductivity type, the first and second portions being aligned with each other.

11. A diode, comprising:
   a substrate;
   a layer on the substrate, the layer having a first conductivity type;
   a structure buried in the layer, the structure including a plurality of components having a second conductivity type, each of the plurality of components having a rectangular shape, lengths of the plurality of components extending in a first direction, widths of the plurality of components extending in a second direction transverse to the first direction, the plurality of components being arranged along the second direction; and
   a first region in the layer, the first region having the second conductivity type, the first region being spaced from the structure by a portion of the layer, the first region directly overlying at least one of the plurality of components in a third direct on transverse to the first and second directions, the plurality of components being positioned on a same side of the first region.

12. The diode of claim 11, further comprising:
   a second region in the layer, the second region having the second conductivity type, the second region contacting the plurality of components.

13. The diode of claim 11, further comprising:
   an isolation trench that encircles the structure.

14. The diode of claim 11, further comprising:
   a trench gate; and
   a trench drain adjacent to the trench gate.

15. The diode of claim 11 wherein each of the plurality of components are spaced from each other by portions of the layer.

16. The diode of claim 11 wherein the plurality of components are configured to form a depletion region in the layer.

17. The avalanche diode of claim 1 wherein the depletion structure includes a third region in the layer, the third region has the second conductivity type, and the third region contacts each of the plurality of second regions.

18. The avalanche diode of claim 17 wherein the third region has a rectangular shape, a width of the third region extends in the first direction, and a length of the third region extends in the second direction.

* * * * *

UNITED STATES PATENT AND TRADEMARK OFFICE
CERTIFICATE OF CORRECTION

PATENT NO. : 10,978,606 B2
APPLICATION NO. : 16/157876
DATED : April 13, 2021
INVENTOR(S) : Laurence Stark Page 1 of 1

It is certified that error appears in the above-identified patent and that said Letters Patent is hereby corrected as shown below:

In the Claims

Column 12, Line 7, Claim 11:
"direct on" should read, --direction--.

Signed and Sealed this
Thirteenth Day of July, 2021

Drew Hirshfeld
*Performing the Functions and Duties of the*
*Under Secretary of Commerce for Intellectual Property and*
*Director of the United States Patent and Trademark Office*